US009603217B2

(12) United States Patent
Nishioka

(10) Patent No.: US 9,603,217 B2
(45) Date of Patent: Mar. 21, 2017

(54) LIGHTING DEVICE AND METHOD FOR CALIBRATING THE SAME

(71) Applicant: Panasonic Intellectual Property Management Co., Ltd., Osaka (JP)

(72) Inventor: Shinsuke Nishioka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/016,998

(22) Filed: Feb. 5, 2016

(65) Prior Publication Data
US 2016/0262221 A1 Sep. 8, 2016

(30) Foreign Application Priority Data

Mar. 4, 2015 (JP) .................................. 2015-042981

(51) Int. Cl.
G05F 1/00 (2006.01)
H05B 33/08 (2006.01)
G01R 31/44 (2006.01)

(52) U.S. Cl.
CPC ............ *H05B 33/086* (2013.01); *G01R 31/44* (2013.01)

(58) Field of Classification Search
CPC Y02B 20/202; Y02B 20/204; H05B 41/2855; H05B 41/386; H05B 41/2882
USPC .................................. 315/291, 307, 308, 312
See application file for complete search history.

(56) References Cited

U.S. PATENT DOCUMENTS

| 8,791,647 B2* | 7/2014 | Kesterson | H05B 33/0815 315/291 |
| 2013/0009553 A1* | 1/2013 | Lee | H05B 33/0824 315/153 |
| 2013/0200802 A1* | 8/2013 | Sakuragi | H05B 33/083 315/122 |
| 2013/0241428 A1* | 9/2013 | Takeda | H05B 33/0827 315/210 |

FOREIGN PATENT DOCUMENTS

| JP | 64-089287 A | 4/1989 |
| JP | 2002-299072 A | 10/2002 |
| JP | 2004-134248 A | 4/2004 |
| JP | 2012-094277 A | 5/2012 |
| JP | 2013-165004 A | 8/2013 |
| JP | 2013-196875 A | 9/2013 |

* cited by examiner

*Primary Examiner* — Minh D A
(74) *Attorney, Agent, or Firm* — Renner, Otto, Boisselle & Sklar, LLP

(57) ABSTRACT

A lighting device which changes a hue of light which the lighting device outputs, by changing a brightness proportion between a first light source and a second light source, the lighting device including: a light source which includes the first light source and the second light source, storage which stores control values for causing the light source to output light having a same hue as a hue of light which is output from a light source included in another lighting device; a current adjuster which calculates a first current value, and a second current value, using the control values; and a power source which supplies a first current to the first light source according to the first current value and supplies a second current to the second light source according to the second current value.

9 Claims, 6 Drawing Sheets

FIG. 5

| COLOR TEMPERATURE (K) / BRIGHTNESS (%) | | 2700 | 3000 | ... | 4500 | ... | 6500 |
|---|---|---|---|---|---|---|---|
| 100 | FIRST LIGHT SOURCE | 0 | 5 | ... | 50 | ... | 100 |
|  | SECOND LIGHT SOURCE | 100 | 100 | ... | 50 | ... | 0 |
| ... | ... | ... | ... | ... | ... | ... | ... |
| 10 | FIRST LIGHT SOURCE | 0 | 0.5 | ... | 5 | ... | 10 |
|  | SECOND LIGHT SOURCE | 10 | 10 | ... | 5 | ... | 0 |
| 0 | FIRST LIGHT SOURCE | 0 | 0 | ... | 0 | ... | 0 |
|  | SECOND LIGHT SOURCE | 0 | 0 | ... | 0 | ... | 0 |

LIGHTING DEVICE AND METHOD FOR CALIBRATING THE SAME

CROSS REFERENCE TO RELATED APPLICATION

This application claims the benefit of priority of Japanese Patent Application No. 2015-042981, filed Mar. 4, 2015, the entire content of which is hereby incorporated by reference.

BACKGROUND

1. Technical Field

The present disclosure relates to a lighting device and a method for calibrating the same.

2. Description of the Related Art

Conventionally, some lighting fixture includes a light source which includes a plurality of light emitting elements, and changes the hue of light from the lighting fixture by changing brightness (e.g., luminous flux) proportion between light emitting elements. For example, the light source included in such a lighting fixture includes a first row of a plurality of first light emitting elements connected in series, and a second row of a plurality of second light emitting elements connected in series, the second row being connected in parallel with the first row. The first light emitting elements and the second light emitting elements output light beams which have different color temperatures. Such a lighting fixture tunes the color of light which the lighting fixture outputs, by changing the brightness proportion between the first row and the second row, as mentioned above.

The lighting fixture disclosed in Japanese Unexamined Patent Application Publication No. 2013-165004 uses the percentage of dimming corresponding to cumulative on-time of the lighting fixture as a countermeasure against degradation of the lighting fixture over time.

SUMMARY

However, particularly in an LED light which includes light emitting diode (LED) elements, individual differences between the LED elements are considerable. Lighting fixtures each include several types of rows of light emitting elements, the different rows of which output light beams having different color temperatures as described above. If the hues of light beams of the light emitting elements are changed by adjusting the brightness proportion between the rows of light emitting elements, such lighting fixtures have a great difference in terms of hue of light beams due to individual differences between the light emitting elements. Such a difference in terms of hue of light beams tends to be greater, in particular, among the light emitting fixtures including more types of rows of light emitting elements.

Particularly in the case where a large number of LED lights of the same kind are arranged within a certain proximity to one another in one room, there arises a problem that the light beams from the LED lights have different hues, due to the individual differences, to an extent that differences in appearance of the light beams from adjacent LED lights are prominently perceivable.

Thus, an object of the present disclosure is to provide a lighting device and a method for calibrating the lighting device which achieve a reduced difference in appearance of light among a plurality of the lighting devices due to the individual differences.

To achieve the above object, a lighting device according to one aspect of the present disclosure is a lighting device which changes a hue of light which the lighting device outputs, by changing a brightness proportion between at least one first light emitting element and at least one second light emitting element, the lighting device including: a light source which includes the at least one first light emitting element and the at least one second light emitting element; storage which stores control values for causing the light source to output light having a same hue as a hue of light which is output from a light source included in another lighting device; a current adjuster which calculates, using the control values, a first current value of a first current to be supplied to the at least one first light emitting element, and a second current value of a second current to be supplied to the at least one second light emitting element; and a power source which supplies the first current to the at least one first light emitting element according to the first current value and supplies the second current to the at least one second light emitting element according to the second current value.

A lighting device according to the present disclosure achieves a reduced difference in appearance of light among a plurality of the lighting devices due to the individual differences.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 5 is a diagram showing an example of a dimming table according to the embodiment.

DETAILED DESCRIPTION OF THE EMBODIMENTS (Details of Problem and Underlying Knowledge Forming Basis of the Disclosure)

As described above, lighting fixtures which have great individual differences therebetween, such as the LED lights each of which includes, as a light source, several types of LED elements which output light beams having different color temperatures, have a problem that the light beams emitted by the lighting fixtures have different hues to an extent prominently perceivable when the lighting fixtures are arranged in one room.

One approach to achieve a uniform hue among a plurality of lighting fixtures is, for example, reducing structural variation among the plurality of lighting fixtures. Examples of the structural variation include variations among the plurality of lighting fixtures in terms of brightness of a row of light emitting elements when drive currents having the same magnitude are supplied to the rows of the plurality of lighting fixtures (variations in the total luminous flux, that is, variations in lumen (the unit of the total luminous flux)), and variations among the plurality of lighting fixtures in terms of output characteristic (a drive current) of a power source which drives a light source.

Figure 1A:
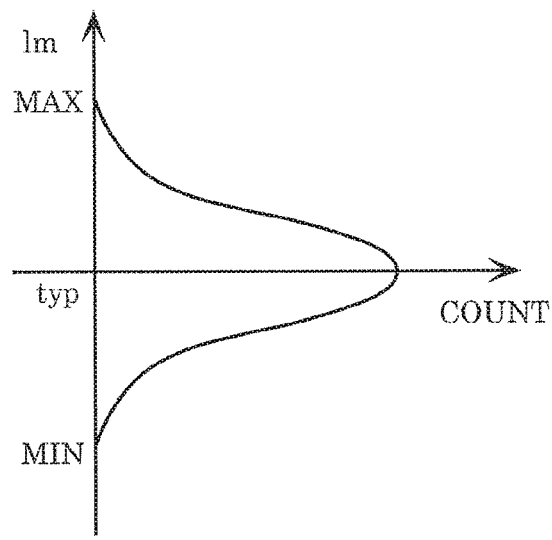
FIG. 1A is a graph depicting an example of variations in luminous flux of rows of light elements
Figure 1B:
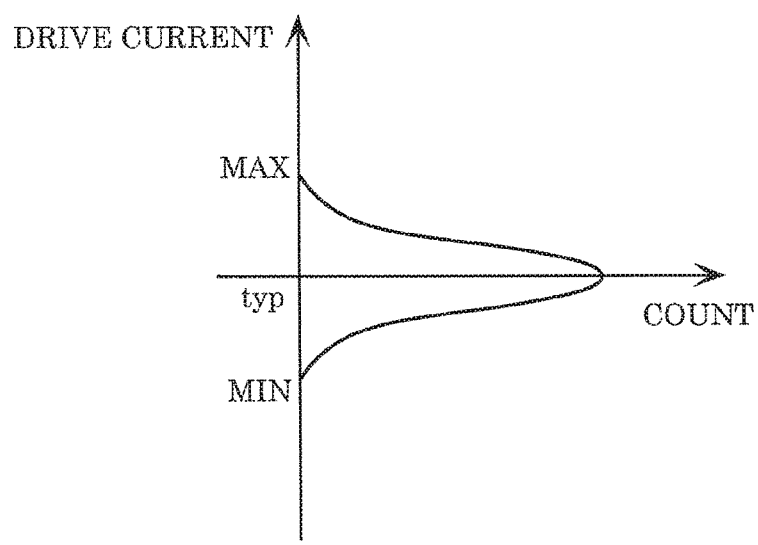
FIG. 1B is a graph depicting an example of variations in output characteristic of power sources which provide power supply voltages to the light sources.

FIG. 1A is a graph depicting an example of variations in terms of a lumen (lm) of a row of light emitting elements, illustrating the distribution of lumens of the rows of light emitting elements when drive currents having the same magnitude are supplied to the rows (COUNT representing the number of rows of light emitting elements exhibiting the corresponding number of lumen). FIG. 1B is a graph depicting an example of variations in terms of output characteristic of a power source which provides a power supply voltage to a light source, illustrating the distribution of magnitudes of drive currents output from power sources included in the lighting devices when the same designated values (the same value designated by an indication of the brightness and the same value designated by an indication of the color temperature) are provided to the power sources (COUNT representing the number of power sources exhibiting the corresponding drive current). FIGS. 1A and 1B are graphs each depicting a result of measurement on the lighting devices designed to have reduced structural variations therebetween. In other words, FIGS. 1A and 1B depict the lighting devices which have relatively small variations therebetween.

As can be seen from FIG. 1A, for example, in the case of the LED light, the lumens of the rows of light emitting elements vary by approximately ±10% to approximately ±15% from a target lumen value (a value "typ" of lumen) which the rows of light emitting elements are designed to have. Moreover, as can be seen from FIG. 1B, in the case of the LED light, drive currents output from the power sources of the LED light vary by approximately ±10% to approximately ±15% from a target drive-current value (a value "typ" of drive current) which the power sources are designed to output. Since the lumens and the drive currents each vary by ±10% to ±15% from their target value, the lighting devices vary in output by approximately 25% in total.

Here, the present disclosure is aimed to place the aforementioned variations among the lighting devices within a range in which light beams output from the lighting devices appear as the same color to the human eye. For example, assume that variations among the lighting devices by approximately 10% falls within the range in which the light beams appear as the same color to the human eye, variations by 25% causes a state in which the light beams appear as different colors to the human eye, that is, the light beams appear differently.

Thus, in the embodiments below, the percentage of dimming is controlled in order to reduce the variations among the lighting devices in terms of hue of light beams emitted by the lighting fixtures.

Hereinafter, the lighting device according to the embodiments is to be described in detail, with reference to the accompanying drawings. It should be noted that embodiments described below are each merely one embodiment of the present disclosure. Values, shapes, materials, components, and arrangement and connection between the components shown in the following embodiments are merely illustrative and not intended to limit the present invention. Thus, among components in the following embodiments, components not recited in any one of the independent claims defining the most generic part of the present disclosure are described as arbitrary components.

Figures are schematic illustration and do not necessarily illustrate the present disclosure as precisely. In the figures, the same reference signs are used to refer to the same components.

Embodiment

Figure 2:
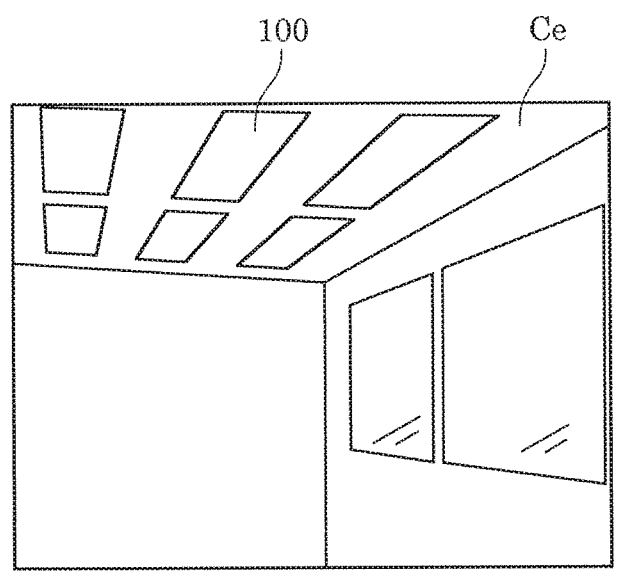
FIG. 2 is a perspective view of an example of the interior of a room in which a plurality of lighting fixtures according to the embodiment are installed.
Figure 3A:
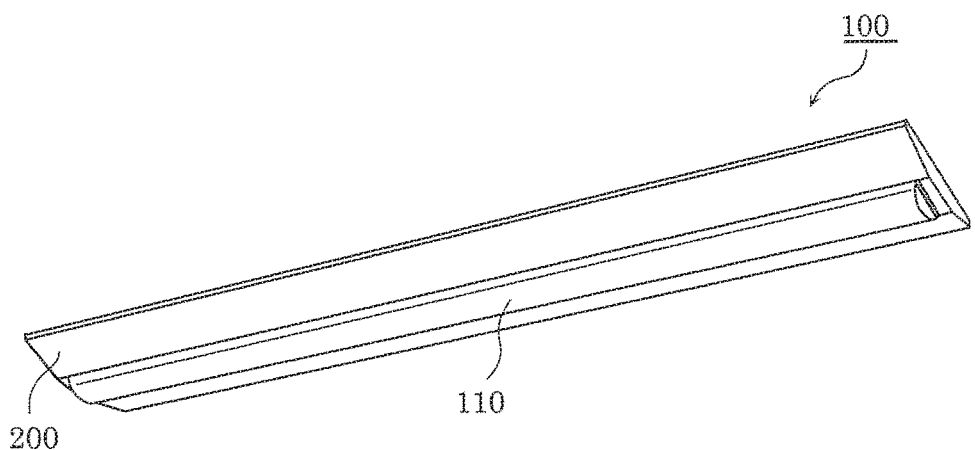
FIG. 3A is a perspective view of an example of the exterior appearance of the lighting fixture according to the embodiment.
Figure 3B:
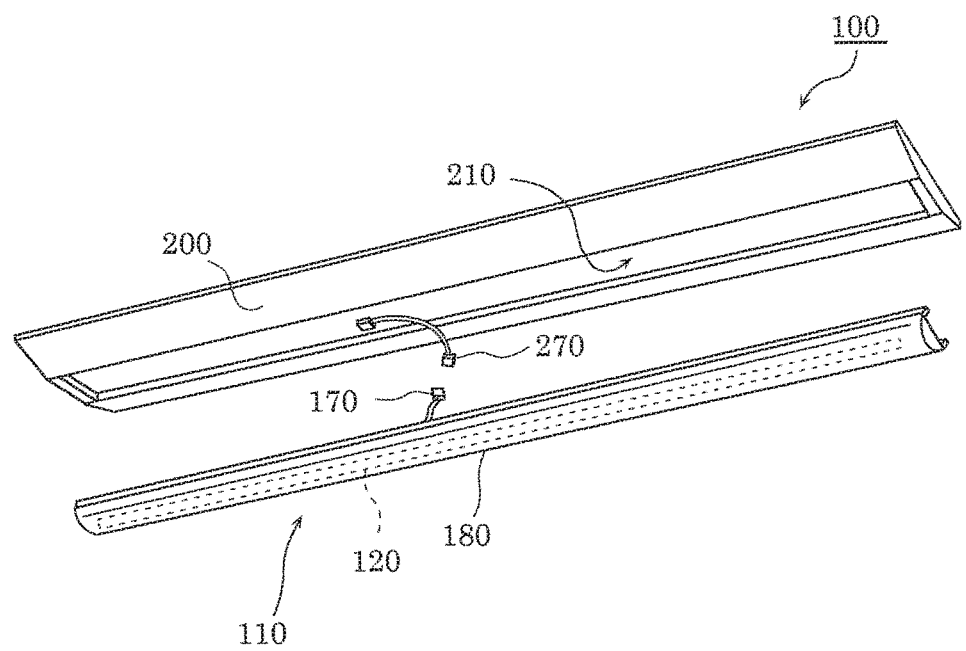
FIG. 3B is an exploded perspective view of an example of the lighting fixture according to the embodiment.
Figure 4:
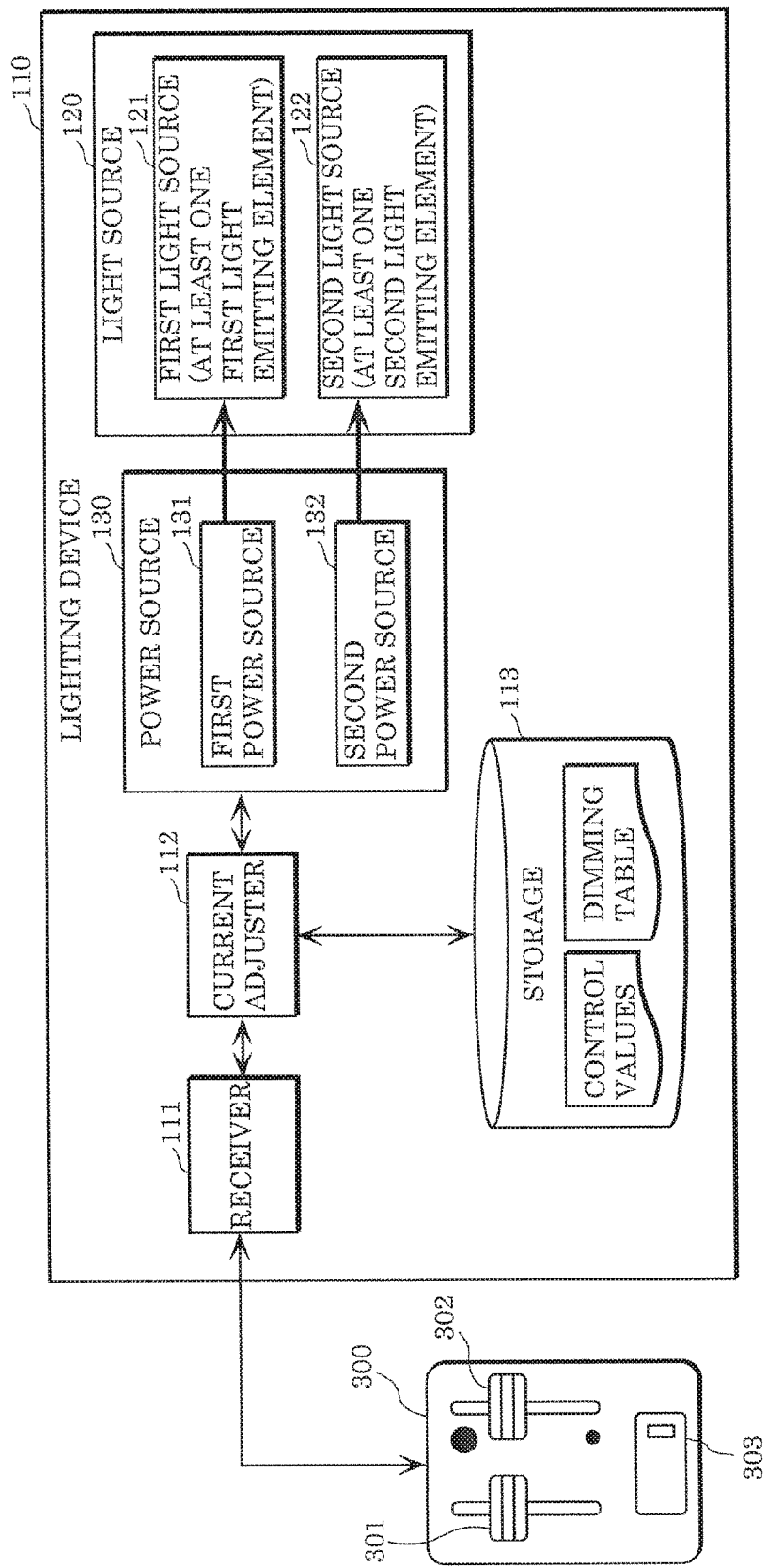
FIG. 4 is a block diagram of an example of a configuration of a lighting device according to the embodiment.

A lighting device according to an embodiment is to be described, with reference to FIGS. 2 through 4. The present embodiment is to be described, with reference to the case where a plurality of the lighting devices are installed in one room.

[1. Overall Configuration of Lighting Device]

FIG. 2 is a perspective view of an example of the interior of a room in which the plurality of lighting fixtures according to the present embodiment are installed. FIG. 3A is a perspective view of an example of the exterior appearance of the lighting fixture according to the embodiment. FIG. 3B is an exploded perspective view of an example of the lighting fixture according to the embodiment. FIG. 4 is a block diagram of an example of a configuration of the lighting device according to the embodiment.

As illustrated in FIG. 2, in the present embodiment, a plurality of lighting fixtures 100 are installed, on ceiling Ce in a matrix, and a surface of each lighting fixture parallel with ceiling Ce is in a rectangular shape.

As illustrated in FIGS. 3A and 3B, lighting fixture 100 according to the embodiment includes lighting device 110 and main body 200.

Main body 200 included in lighting fixture 100 is a supporting member and fixed to ceiling Ce, using, for example, bolts and nuts. Lighting device 110 is detachably mounted onto main body 200.

Lighting fixture 100 also includes connectors 270 and 170. Connector 270 is provided at an end of a wire extending from main body 200. Connector 170 is provided at an end of a wire extending from lighting device 110. Interconnection of connectors 270 and 170 allows supply of power from main body 200 to lighting device 110, which power is required for lighting device 110 to emit light.

It should be noted that, although not shown in FIGS. 3A and 3B, if, for example, a user conducts operations, such as turning on and off and dimming of lighting device 110, using a console installed on a wall or otherwise provided, a control line for exchanging signals between the console and lighting device 110 connects the console and lighting device 110. The signals may be exchanged between the console and lighting device 110 wirelessly.

Lighting device 110 includes light source 120 which emits illumination light, and cover member 180 over light source 120.

Light source 120 includes several types of light emitting elements which emit light beams having different color temperatures. Light source 120 is a light emitting module capable of dimming control (brightness control) and color-tuning control (emission-color control). In the present embodiment, light source 120 includes LED elements as light sources. Details of lighting device 110, such as an example of control of light source 120, are to be described below.

Cover member 180 transmits light emitted by light source 120. In the present embodiment, cover member 180 also has a function of diffusing the light emitted by light source 120. For example, cover member 180 comprises a light-transmissive glass or a light-transmissive resin, and has, on its inner or outer surface, opal light diffusing coating which is formed by applying a resin containing light diffusing material (fine particles), such as silica or calcium carbonate, onto the inner or outer surface or by adhering white pigments to the inner or outer surface.

It should be noted that cover member 180 is not required to have the function of diffusing the light. For example, cover member 180 may be transparent to an extent that the interior of cover member 180 is visible from the outside.

Moreover, the shape and the configuration of lighting device 110 are not limited to those illustrated in FIGS. 3A and 3B. For example, the exterior appearance of lighting device 110 in plan view may be in a circular shape, a square shape, etc. Moreover, cover member 180 for covering light source 120 may be absent if, for example, the entirety of light source 120 is encapsulated by a light transmissive resin.

[2. Configuration of Lighting Device]

Next, the basic configuration and operation of lighting device 110 according to the present embodiment are to be described, with reference to FIG. 4.

As shown in FIG. 4, lighting device 110 includes light source 120, receiver 111, current adjuster 112, and storage 113.

Light source 120 turns on and off, according to control by current adjuster 112. In the present embodiment, light source 120 includes first light source 121 and second light source 122. First light source 121 includes at least one first LED element (a first light emitting element) which outputs light having a first color temperature. Second light source 122 includes at least one second LED element (a second light emitting element) which outputs light having a second color temperature different from the first color temperature. For example, the first color temperature is a higher color temperature and the second color temperature is a lower color temperature below the first color temperature.

Specifically, in the present embodiment, first light source 121 emits light which has, generally known as, a daylight color, for example, and second light source 122 emits light which has, generally known as, a warm white color, for example. The hue of the light from light source 120 is changed by changing the light output balance (proportion) of the two types of light sources that are included in light source 120 and emit the light beams having different color temperatures.

The present embodiment is to be described, with reference to the case where light source 120 includes a light source which outputs light having a color temperature of 2700 K by way of example of the light source which outputs the light having the lower color temperature, and a light source which outputs light having a color temperature of 6500 K by way of example of the light source which outputs the light having the higher color temperature. In this case, the use of these two light sources allows light source 120 to change in color temperature of light therefrom in a range from at least 2700 K to at least 6500 K. In other words, light source 120 according to the present embodiment can change the color temperature of light which light source 120 is to output in a range from the lower color temperature to the higher color temperature. It should be noted that the lower color temperature and the higher color temperature are merely an example and may be determined arbitrarily, according to the applications of lighting device 110, for example.

While in the present embodiment, light source 120 includes two different types of LED elements which emit light beams having different color temperatures, the present disclosure is not limited thereto. Light source 120 may include three or more different types of LED elements which emit light beams having three or more different color temperatures.

Receiver 111 is a receiver device which receives a signal transmitted from an external device such as console 300, for example. Receiver 111 receives a signal transmitted from the external device and outputs the signal to current adjuster 112.

Here, console 300 is a device fixedly installed, for example, on the wall in the room. Console 300 includes slide bar 301 and slide bar 302 which are for setting color temperature (K) and brightness, respectively, of light from light source 120, and power switch 303 which switches the on-state and the off-state of light source 120. When the user operates slide bars 301 or 302, or power switch 303, console 300 transmits at least one of the following signals: a signal indicating a color temperature; a signal indicating brightness; and a signal indicating turning on or off of light source 120. For example, if the user operates slide bar 301, console 300 transmits to receiver 111 a signal indicating a color temperature indicated by a position of slide bar 301 after slide bar 301 is operated (hereinafter, referred to as a "designated value of color temperature," accordingly). If the user operates slide bar 302, console 300 transmits to receiver 111 information indicating brightness indicated by a position of slide bar 302 after slide bar 302 is operated (hereinafter, refers as a "designated value of brightness," accordingly). If the user operates power switch 303, console 300 transmits a signal indicating turning on or off of light source 120 in accordance with a position of power switch 303 (a position indicating the on-state or the off-state of light source 120).

It should be noted that the device which transmits the various signals to receiver 111 is not limited to console 300. Examples of the device which transmits the various signals to receiver 111 include a console which includes a power switch only, a remote (a remote control) which transmits the signals wirelessly (e.g., via infrared), and a mobile terminal such as a mobile phone or a tablet. Receiver 111 can be a hardwired interface between console 300 and current adjuster 112, a wireless interface (e.g., infrared, Bluetooth (registered trademark), Z-Wave (registered trademark), 802.11), etc.

Current adjuster 112 provides control over operations of light source 120, such as turning on and off and dimming (brightness adjustment) of light source 120 and tuning of a color (emission color (color temperature) adjustment) of light from light source 120. Specifically, current adjuster 112 adjusts magnitudes of currents to be supplied to first light source 121 and second light source 122, in accordance with the designated value of color temperature and the designated value of brightness which are received by receiver 111, and control values stored in storage 113.

Current adjuster 112 is implemented as, for example, a micro controller, a dedicated circuit, or the like.

Storage 113 is a nonvolatile memory device storing control values. Storage 113 is, for example, a semiconductor memory such as flash memory or an electrically erasable programmable read-only memory (EEPROM).

Storage 113 is storing a dimming table. The dimming table lists first reference values RI1 (%, K) for currents supplied to first light source 121, and second reference values RI2 (%, K) for currents supplied to second light source 122, relative to designated values of brightness (%) and designated values of color temperature (K).

Power source 130 includes first power source 131 and second power source 132. First power source 131 and second power source 132 supply the drive currents to first light source 121 and second light source 122, respectively, according to the control signals from current adjuster 112.

In the following, for the purposes of description, first light source 121 which, upon being supplied with a predetermined drive current, outputs light having a lumen equal to a target lumen as designed is referred to as a first reference light source. The value of the target lumen is the value typ in FIG. 1A. Like second light source 122 which, upon being supplied with a predetermined drive current, outputs light having a lumen equal to a target lumen as designed is referred to as a second reference light source. The value of the target lumen is the value "typ" in FIG. 1A. First power source 131 is referred to as a first reference power source. When predetermined designated values of color temperature and brightness are provided, first power source 131 outputs a drive current having the same magnitude as a target magnitude value which first power source 131 is designed to output a drive current with. Likewise, second power source 132 which, upon being provided with predetermined designated values of color temperature and brightness, outputs a drive current having a magnitude equal to a target magnitude value as designed is referred to as a second reference power source.

The dimming table lists magnitudes of currents, for each combination of a designated value of color temperature and a designated value of brightness, which are supplied to the first reference light source and the second reference light source included in the lighting device which includes the first reference power source, the second reference power source, first light source 121 and second light source 122.

FIG. 5 is a diagram showing an example of the dimming table according to the present embodiment. In the dimming table shown in FIG. 5, first reference value RI1 (%, K) is represented as a proportion relative to a maximum value of a drive current that can be supplied to first light source 121. Second reference value RI2 (%, K) is represented as a proportion relative to a maximum value of a drive current that can be supplied to second light source 122. For example, when the designated value of color temperature is 2700 K and the designated value of brightness is 100%, the first reference value for first light source 121 is 0% and the second reference value for second light source 122 is 100%. When the designated value of color temperature is 3000 K and the designated value of brightness is 100%, the first reference value for first light source 121 is 5% and the second reference value for second light source 122 is 100%. When the designated value of color tempera is 4500 K and the designated value of brightness is 100%, the first reference value for first light source 121 is 50% and the second reference value for second light source 122 is 50%. When the designated value of color temperature is 6500 K and the designated value of brightness is 100%, the first reference value for first light source 121 is 100% and the second reference value for second light source 122 is 0%.

Moreover, for example, when the designated value of color temperature is 2700 K and the designated value of brightness is 10%, the first reference value for first light source 121 is 0% and the second reference value for second light source 122 is 10%. When the designated value of color temperature is 3000 K and the designated value of brightness is 10%, the first reference value for first light source 121 is 0.5% and the second reference value for second light source 122 is 10%. When the designated value of color temperature is 4500 K and the designated value of brightness is 10%, the first reference value for first light source 121 is 5% and the second reference value for second light source 122 is 5%. When the designated value of color temperature is 6500 K and the designated value of brightness is 10%, the first reference value for first light source 121 is 10% and the second reference value for second light source 122 is 0%.

While in the present embodiment, the reference values are expressed as proportions relative to the respective maximum values, it should be noted that the reference value may be a current value (A), or may be any other indication.

It should be noted that the numeric values listed in the dimming table shown in FIG. 5 are merely an example and may be set arbitrarily, according to, for example, color temperatures of the light beams which are output from first light source 121 and second light source 122.

Storage 113 is further storing control values for causing light source 120 to output light which has the same hue as a hue of a light source included in another lighting device. Here, the light having the same hue refers to light beams having a color temperature and brightness that are completely consistent, and also light beams within a brightness range and a color-temperature range in which the light beams appear as the same color to the human eye. As described above, given that the range in which the light beams appear as the same color to the human eye is, for example, 10%, the light beams having the same hue has, for example, color temperatures in a range of deviation of 10% from the designated value of color temperature, and brightness levels in a range of deviation of 10% from the designated value of brightness. It should be noted that the color-temperature range and the brightness range in which the light beams appear as the same color to the human eye are not limited to within the range of deviation of 10% from the designated value of color temperature and the designated value of brightness, respectively.

The control values in the present embodiment, which are to be described, in further detail below, are coefficients by which the reference values are multiplied (specifically, the reference values are multiplied by inverse numbers of the control values, which is to be described in further detail below). In the present embodiment, the control values include a first control value for correcting the variation in lumen of the light output from first light source 121, and a second control value for correcting the variation in lumen of the light output from second light source 122. The control values further include a third control value for correcting the variation in drive current output from first power source 131, and a fourth control value for correcting the variation in drive current output from second power source 132.

Storage 113 may further include information no update of which is required, such as date of manufacture, a manufacturer, the factory in which lighting device 110 was manufactured, a model number, life, a lot number, and a size, for example, and information the update of which is required accordingly, such as cumulative on-time of light source 120, for example.

[3. Method for Calibrating Lighting Device]

Figure 6:
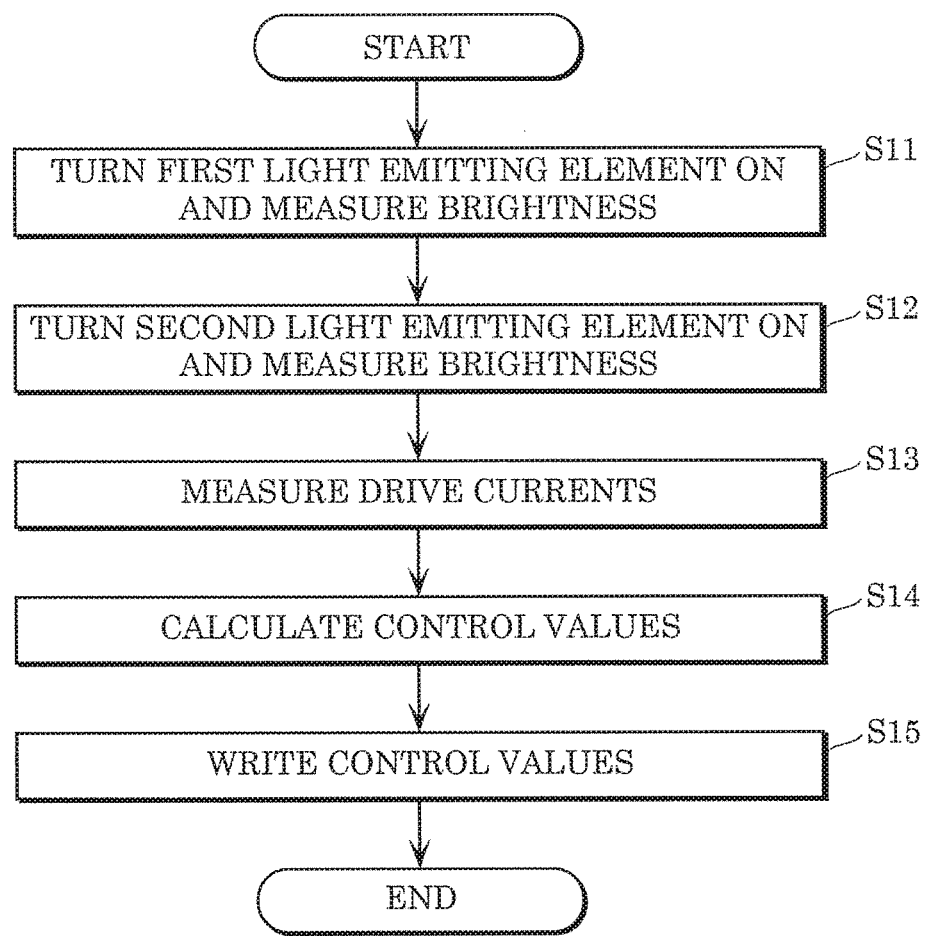
FIG. 6 is a flowchart illustrating an example of procedure of a method for calibrating the lighting device according to the embodiment.

A method for calibrating lighting device 110 is described, with reference to FIG. 6.

FIG. 6 is a flowchart illustrating an example of procedure of the method for calibrating lighting device 110 according to the embodiment. FIG. 6 illustrates a step of calculating the control values, among steps included in the method for calibrating lighting device 110.

The method for calibrating the lighting device illustrated in FIG. 6 is performed by a calibration device not shown in the drawings. The calibration device as used herein includes a power source (different from the power source of lighting device 110) which supplies drive to light source 120, an illumination meter, a power source controller which provides power source 130 with the designated values of color temperature and brightness, a computing unit which calculates the control values, and a communication unit which writes data to storage 113.

The calibration device, first, measures brightness levels of first light source 121 and second light source 122 included in light source 120 (S11, S12). It should be noted that the present embodiment is described with reference to the case where the brightness levels of first light source 121 and second light source 122 are measured prior to assembling of lighting device 110, that is, the brightness level of first light source 121 and the brightness level of second light source 122 are measured independently.

The calibration device turns first light source 121 on and measures brightness of the light emitted by first light source 121 (S11). Specifically, the calibration device turns first light source 121 on by supplying first light source 121 with a first drive current, which is a test drive current having a predetermined magnitude, using the power source included in the calibration device. The calibration device at this time does not supply a drive current to second light source 122, keeping second light source 122 off. The calibration device measures a lumen (the total luminous flux) of the light emitted by first light source 121, using the illumination meter, in a state where first light source 121 is on and second light source 122 is off. The calibration device stores a first measured value, which is a result of the measurement of the lumen of the light emitted by first light source 121, into storage included in the calibration device.

The calibration device turns second light source 122 on and measures brightness of the light emitted by second light source 122 (S12). The calibration device, as with step S11, turns second light source 122 on by supplying second light source 122 with a second drive current, which is a test drive current having a predetermined magnitude, using the power source included in the calibration device. The calibration device measures a lumen of the light emitted by second light source 122, using the illumination meter, in a state where second light source 122 is on and first light source 121 is off. The calibration device stores a second measured value, which is a result of the measurement of the lumen of the light emitted by second light source 122, into the storage included in the calibration device.

It should be noted that the magnitude of the first drive current supplied to first light source 121 for the measurement of first light source 121 and the magnitude of the second drive current supplied to second light source 122 for the measurement of second light source 122 need not be the same.

The calibration device further measures power source 130 (S13). It should be noted that the present embodiment is described with reference to the case where the drive currents output from first power source 131 and second power source 132 are measured prior to assembling of lighting device 110, that is, the drive current output from first power source 131 and the drive current output from second power source 132 are measured independently.

Specifically, the calibration device provides first power source 131 with a first designated value, which is a predetermined designated value for testing, and measures an output value (a third measured value) of a drive current actually output from first power source 131. Furthermore, the calibration device provides second power source 132 with a second designated value, which is a predetermined designated value for testing, and measures an output value (a fourth measured value) of a drive current actually output from second power source 132. The first designated value and the second designated value need not be the same. The calibration device stores the results of the measurements of the drive currents into the storage included in the calibration device.

After performing steps S11 through S13, the calibration device calculates the control values (S14).

The above steps S11 through S13 are performed as follows, for example. First, lighting device 110 is assembled by combining light source 120 and power source 130 which have respective values type of the characteristics (the lumen, the drive current) exhibiting more or less the same deviation. Then, the first measured value and the second measured value of light source 120 included in lighting device 110 are obtained. Furthermore, the third measured value and the fourth measured value of power source 130 included in lighting device 110 are obtained.

In step S14, the calibration device calculates the first control value, using the first measured value. The first control value is an index value for calculating a first current value which is used to turn first light source 121 on at a target lumen value. The first control value is represented as a proportion of the first measured value relative to the target value of brightness. Here, the calibration device calculates the first control value by dividing the first measured value by the target value of lumen of light from first light source 121. The target value of lumen is by way of example of the target value of brightness.

Likewise, the calibration device calculates the second control value, which is a proportion of the second measured value relative to the target value of lumen of light from second light source 122, by dividing the second measured value by the target value of lumen of light from second light source 122.

The calibration device also calculates the third control value, which is a proportion of the third measured value relative to the target value of drive current which first power source 131 is to output, by dividing the third measured value by the target value of drive current which first power source 131 is to output.

Further, the calibration device calculates the fourth control value, which is a proportion of the fourth measured value relative to the target value of drive current which second power source 132 is to output, by dividing the fourth measured value by the target value of drive current which second power source 132 is to output.

The calibration device writes the calculated control values (the first, second, third, and fourth control values) via the communication unit to storage 113 included in lighting device 110 (S15).

[4. Operation of Lighting Device]

Operation of lighting device 110 using the control values is described.

If receiver 111 receives from console 300 the signal indicating that power switch 303 is switched to the on-state, current adjuster 112 functions to obtain the control values (the first, second, third, and fourth control values) from storage 113.

Specifically, adjuster 112 obtains a designated value of color temperature and a designated value of brightness from console 300 via receiver 111, in accordance with the settings of slide bars 301 and 302. Current adjuster 112 searches through the dimming table stored in storage 113, using the designated value of color temperature and the designated value of brightness, and obtains the first reference value for first light source 121 and the second reference value for second light source 122.

Using the first reference value, the second reference value, and the first, second, third, and fourth control values, current adjuster 112 calculates the first current value which is actually supplied to first light source 121 and a second current value which is actually supplied to second light source 122. Current adjuster 112 in turn provides control signals to first power source 131 and second power source 132 predesigned to result in the first current value and second current value actually being supplied to first light source 121 and second light source 122, respectively.

In the present embodiment, the first current value is calculated as first reference value RI1 (%, K)×(1/the first control value)×(1/the third control value). The second current value is calculated as second reference value RI2 (%, K)×(1/the second control value)×(1/the fourth control value).

For example, if the first control value is 1.1 and the third control value is 1.03, the first current value is calculated as RI1 (%, K)×(1/1.1)×(1/1.03). If the second control value is 1.05 and the fourth control value is 0.9, the second current value is calculated as RI2 (%, K)×(1/1.05)×(1/0.9).

Current adjuster 112 may further adjust the determined current values, using information such as cumulative on-time of light source 120, as a countermeasure against reduction of the lumen over time.

[5. Effects]

Lighting device 110 according to the present embodiment calculates the magnitudes of the drive currents which are to be supplied to first light source 121 and second light source 122, using the control values for causing a plurality of lighting devices 110 to output light beams having the same hue. This allows the hues and brightness levels of the light beams output from lighting devices 110 to be made uniform with the designated value of color temperature and the designated value of brightness, respectively. Particularly in the case where the plurality of lighting devices are arranged within a certain proximity to one another in one space, differences in appearance of the light beams from the plurality of lighting devices due to the individual differences can be reduced.

Moreover, according to the method for calibrating lighting device 110 of the present embodiment, the control values for causing the plurality of lighting devices to output light beams having the same hue can be obtained in a suited, simple manner. Lighting device 110 fabricated using the calibration method described above achieves the plurality of lighting devices 110 that have brightness levels and color temperatures substantially the same as the designated value of brightness and the designated value of color temperature, respectively. For this reason, the difference in appearance of light beams from the plurality of lighting devices 110 is hardly prominent to the human eye even when the plurality of lighting devices 110 are arranged within a certain proximity to one another in one space.

Other Embodiment

As described above, the lighting device and the method for calibrating the same according to one aspect of the present invention have been described, with reference to the embodiment. However, the present invention is not limited to the above embodiment.

(1) While in the above embodiment, the control values each represent a proportion of a measured value relative to a target value, the present invention is not limited thereto. For example, a result which the calibration device calculates as (1/the first control value)×(1/the third control value) may be a control value for first light source 121, and a result which the calibration device calculates as (1/the second control value)×(1/the fourth control value) may be a control value for second light source 122. In this case, computational burden on lighting device 110 is reduced.

(2) While in the above embodiment, in steps S11 and S12, the calibration device measures the brightness levels of first light source 121 and second light source 122, respectively, when the test drive currents are provided, the present invention is not limited thereto. The calibration device may measure values of the drive currents provided to first light source 121 and second light source 122 when the brightness levels of first light source 121 and second light source 122 are equal to respective target values.

Specifically, the calibration device may measure a magnitude (the first measured value) of a drive current supplied to first light source 121 in a state where first light source 121 is on at a predetermined brightness level and second light source 122 is off. Further, the calibration device may measure a magnitude (the second measured value) of a drive current supplied to second light source 122 in a state where second light source 122 is on at a predetermined brightness level and first light source 121 is off. This process, as with the above calibration method, conducts the measurements for capturing the relationship between the brightness of first light source 121 and the magnitude of the drive current supplied to first light source 121 and the relationship between the brightness of second light source 122 and the magnitude of the drive current supplied to second light source 122.

Likewise, while in the above embodiment, in step S13, the calibration device measures the magnitudes of the drive currents output from first power source 131 and second power source 132 when the designated values for testing are provided, the present invention is not limited thereto. The calibration device may obtain designated values provided to first power source 131 and second power source 132 when the drive currents output from first power source 131 and second power source 132 are respective target values.

(3) While in the above embodiment, the present invention is described with reference to the case where power source 130 includes two outputs which are first power source 131 and second power source 132, the present invention is not limited thereto. For example, power source 130 may include one output and the one output may be distributed to first light source 121 and second light source 122. In this case, presumably, the third control value and the fourth control value are the same value.

(4) While in the above embodiment, the calibration device separately measures the total luminous flux (lumen) of first light source 121 and the total luminous flux (lumen) of second light source 122, and separately measures the drive current output from first power source 131 and the drive current output from second power source 132. However, first power source 131 and second power source 132 may be assembled and the calibration device may measure the total luminous flux of light source 120. In this case, measured values are affected by the variations in lumen of light beams from first light source 121 and second light source 122 and the variations in drive current output from first power source 131 and second power source 132.

(5) In the above embodiment, while current adjuster 112 and power source 130 are described as separate components in FIG. 4 for the purposes of description, power source 130 may include some or all the functionality of current adjuster 112. Further, while storage 113 and power source 130 are described as separate components in FIG. 4 for the purposes of description, storage 113 may include the storage included in power source 130. In other words, data such as the dimming table may be stored in storage build in power source 130.

(6) In other instances, various modifications to the exemplary embodiment according to the present invention described above that may be conceived by a person skilled in the art and embodiments implemented by any combination of the components and functions shown in the exemplary embodiment are also included within the scope of the present invention, without departing from the spirit of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A lighting device which changes a hue of light which the lighting device outputs, by changing a brightness proportion between at least one first light emitting element and at least one second light emitting element, the lighting device comprising:
   a light source which includes the at least one first light emitting element and the at least one second light emitting element;
   storage which stores control values for causing the light source to output light having a same hue as a hue of light which is output from a light source included in another lighting device when the lighting device and the other lighting device are given a same user designated value;
   a current adjuster which calculates, using the control values, a first current value of a first current to be supplied to the at least one first light emitting element, and a second current value of a second current to be supplied to the at least one second light emitting element; and
   a power source which supplies the first current to the at least one first light emitting element according to the first current value and supplies the second current to the at least one second light emitting element according to the second current value.

2. The lighting device according to claim 1, wherein the control values include:
   a first control value indicating a proportion of actual brightness of the at least one first light emitting element when a predetermined first drive current is supplied, relative to a target value of brightness of the at least one first light emitting element when the predetermined first drive current is supplied; and
   a second control value indicating a proportion of actual brightness of the at least one second light emitting element when a predetermined second drive current is supplied, relative to a target value of brightness of the at least one second light emitting element when the predetermined second drive current is supplied.

3. The lighting device according to claim 1, wherein the control values include:
   a third control value indicating a proportion of an output value of an actual drive current which the power source outputs to the at least one first light emitting element when a predetermined first designated value is provided, relative to a target value of a drive current which the power source is to output to the at least one first light emitting element according to the predetermined first designated value; and
   a fourth control value indicating a proportion of an output value of an actual drive current which the power source outputs to the at least one second light emitting element when a predetermined second designated value is provided, relative to a target value of a drive current which the power source is to output to the at least one second light emitting element according to the predetermined second designated value.

4. The lighting device according to claim 1, wherein the storage further stores a dimming table listing, for each hue, a first reference value for a drive current to be supplied to the at least one first light emitting element, and a second reference value for a drive current to be supplied to the at least one second light emitting element, and
   the current adjuster calculates the first current value by multiplying the first reference value by a coefficient calculated using the control values, and calculates the second current value by multiplying the second reference value by a coefficient calculated using the control values.

5. The lighting device according to claim 1, wherein light emitted by the at least one first light emitting element and light emitted by the at least one second light emitting element have different color temperatures.

6. A method for calibrating a lighting device which includes a light source which includes at least one first light emitting element and at least one second light emitting element, the method comprising:
   obtaining a first measured value by measuring brightness of the at least one first light emitting element in a state where the at least one first light emitting element is turned on by being supplied with a predetermined first drive current and the at least one second light emitting element is off, the first measured value indicating a result of measuring the brightness of the at least one first light emitting element;
   obtaining a second measured value by measuring brightness of the at least one second light emitting element in a state where the at least one second light emitting element is turned on by being supplied with a predetermined second drive current and the at least one first light emitting element is off, the second measured value indicating a result of measuring the brightness of the at least one second light emitting element;
   calculating, using the first measured value and the second measured value, control values for causing the light source to output light having a same hue as a hue of light which is output from a light source included in another lighting device when the lighting device and the other lighting device are given a same user designated value; and
   storing the control values into storage included in the lighting device.

7. The method according to claim 6, wherein when the control values are calculated, a first control value and a second control value are calculated as the control values, the first control value indicating a proportion of the first measured value relative to a target value of brightness of the at least one first light emitting element, the second control value indicating a proportion of the second measured value relative to a target value of brightness of the at least one second light emitting element.

8. The method according to claim 6, wherein
the lighting device further includes a power source which supplies a first drive current to the at least one first light emitting element and a second drive current to the at least one second light emitting element,
the method further comprising:
obtaining a third measured value by measuring a magnitude of the first drive current output from the power source to the at least one first light emitting element when a predetermined designated value is provided, the third measured value indicating the magnitude of the first drive current output to the at least one first light emitting elements; and
obtaining a fourth measured value by measuring a magnitude of the second drive current output from the power source to the at least one second light emitting element when a predetermined designated value is provided, the fourth measured value indicating the magnitude of the second drive current output to the at least one second light emitting element, wherein
when the control values are calculated, a third control value and a fourth control value are further calculated, the third control value indicating a proportion of the third measured value relative to a target value of a drive current which the power source is to output to the at least one first light emitting element, the fourth control value indicating a proportion of the fourth measured value relative to a target value of a drive current which the power source is to output to the at least one second light emitting element, and
when the control values are stored, the third control value and the fourth control value, besides the first control value and the second control value, are stored into the storage included in the lighting device.

9. A method for calibrating a lighting device which includes a light source which includes at least one first light emitting element and at least one second light emitting element, the method comprising:
obtaining a first measured value by measuring a magnitude of a drive current supplied to the at least one first light emitting element in a state where the at least one first light emitting element is on at predetermined brightness and the at least one second light emitting element is off, the first measured value indicating a result of measuring the magnitude of the drive current supplied to the at least one first light emitting element;
obtaining a second measured value by measuring a magnitude of a drive current supplied to the at least one second light emitting element in a state where the at least one second light emitting element is on at predetermined brightness and the at least one first light emitting element is off, the second measured value indicating a result of measuring the magnitude of the drive current supplied to the at least one second light emitting element;
calculating, using the first measured value and the second measured value, control values for causing the light source to output light having a same hue as a hue of light which is output from a light source included in another lighting device; and
storing the control values into storage included in the lighting device.

* * * * *